United States Patent [19]

Heiter et al.

[11] 4,122,399

[45] Oct. 24, 1978

[54] DISTORTION GENERATOR

[75] Inventors: George Ludwig Heiter, Andover; Hotze Miedema, Boxford, both of Mass.; Edwin Charles Moore, Windham, N.H.

[73] Assignee: Bell Telephone Laboratories, Incorporated, Murray Hill, N.J.

[21] Appl. No.: 858,118

[22] Filed: Dec. 7, 1977

[51] Int. Cl.² ............................................. H03F 1/32
[52] U.S. Cl. ................................... 330/149; 328/163
[58] Field of Search ...................... 330/149; 328/163; 332/18, 37 R; 325/46, 472, 476

[56] References Cited

U.S. PATENT DOCUMENTS

| | | | |
|---|---|---|---|
| 3,383,618 | 5/1968 | Engelbrecht | 330/149 |
| 3,755,754 | 8/1973 | Putz | 330/149 |
| 3,952,260 | 4/1976 | Prochazka et al. | 330/149 |
| 4,068,186 | 1/1978 | Sato et al. | 330/149 |

Primary Examiner—James B. Mullins
Attorney, Agent, or Firm—Sylvan Sherman

[57] ABSTRACT

The problems of high cost, high loss and incomplete distortion compensation are resolved in a distortion generating circuit which employs a nonlinear phase modulator (70, FIG. 7) and a linear phase shifter (71) as a means of generating selected distortion signal components. The circuit includes an output coupler (30) and an output coupler (31) interconnected by means of a pair of wavepaths (32, 33). The nonlinear phase modulator (70), which includes a nonlinear reactive element (37), is disposed in one of the wavepaths (32). The linear phase shifter (71) is included in the other wavepath (33). By the appropriate adjustment of the linear phase shift in wavepath (33) the entire gamut of distortion characteristics can be compensated. Distortion generating circuits of the type disclosed can be employed as either predistorters or as postdistorters to compensate for the nonlinearities in electromagnetic signal devices, such as amplifiers.

5 Claims, 8 Drawing Figures

DISTORTION GENERATOR

TECHNICAL FIELD

This invention relates to distortion compensating generators and, in particular, to such generators that are capable of generating selected distortion components for compensating a broad range of nonlinear transfer characteristics.

BACKGROUND ART

Predistortion and postdistortion techniques, for cancelling the distortion introduced by the nonlinear transfer characteristc of electromagnetic signal devices, are well known in the art. Typically, in such circuits a distortion generator is included in either the input or the output circuit of the device for the purpose of introducing compensating distortion components which serve to cancel the distortion components produced by the signal device. Obviously, the distortion compensating generator must be capable of operating over the same dynamic range and the same frequency band as the device to be compensated. In addition, the relative magnitudes and phases of the compensating components generated should be such as to cancel all the significant distortion components produced by the signal device without itself introducing other spurious distortion components. Finally, all of this must be done at a reasonable cost if it is to have any commercial value. For example, U.S. Pat. No. 3,755,754 dicloses an arrangement for compensating an amplifier employing a velocity modulation tube by means of a second velocity modulation tube or other device that has a distortion characteristic that is substantially similar to that of the amplifier to be corrected. Such an arrangement, however, can be prohibitively expensive if the only way of matching the distortion characteristic of the amplifier is to add a second, like amplifier to the circuit.

U.S. Pat. No. 3,952,260 provides an alternative distortion correcting circuit employing a less expensive diode as the nonlinear element. In this circuit, however, the diode is forward-biased and serves as a nonlinear resistance. Aside from the added loss introduced by the forward-biased diode, there appears to be no means for compensating nonlinear phase distortion. Thus, only partial compensation is possible by this arrangement.

U.S. Pat. No. 3,383,618 similarly employs a diode as a distortion compensating generator. Used in this manner, a relatively large component of the useful signal is required to drive the diode in order to produce the necessary distortion components. A correspondingly large signal component may then interact destructively with the useful signal at the output of the distortion generator thereby reducing the total output signal. In addition, the diode itself, in order to produce amplitude distortion compensating components, must serve as a nonlinear resistor and, thereby, introduces loss to the system.

Thus, the prior art distortion generators tend to be relatively costly and inefficient.

SUMMARY OF THE INVENTION

The problems of high cost, high loss and incomplete distortion compensation are resolved in a distortion compensating generator comprising an input coupler and an output coupler interconnected by means of a pair of wavepaths. One wavepath includes a linear phase shifter. The other includes a nonlinear distorter. The distorter is characterized in that the nonlinear circuit portion is a nonlinear phase modulator, and in that the phase shift introduced by the linear phase shifter is selected as a function of the nonlinear characteristic of the signal device to be compensated. In accordance with the present invention, the entire gamut of nonlinear characteristics can be accommodated by the simple expedient of changing the phase shift introduced by the linear phase shifter.

IN THE DRAWINGS

DETAILED DESCRIPTION

Figure 1:
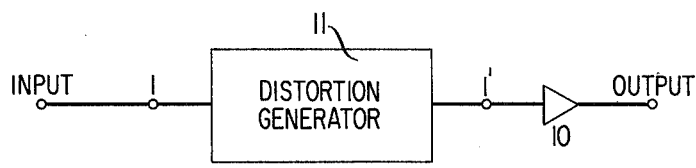
FIG. 1 shows, in block diagram, a distortion generator used as a predistorter to generate distortion cancelling signal components.

Referring to the drawing, FIG. 1 shows the use of the distortion generator as a predistorter 11 for cancelling intermodulation distortion components produced by the nonlinearities in the input-output characteristic of an amplifier 10. Ideally, the output signal of amplifier 10 would be an amplified replica of its input signal. However, because of slight nonlinearities in the amplifier's transfer characteristic, spurious signal components are produced which must be removed. The function of the predistorter is to generate compensating higher order distortion components which are then introduced into the input circuit of amplifier 10 in a manner to combine destructively in the amplifier output circuit with the distortion components produced by the amplifier. The present discussion of the invention relates particular to the manner in which these distortion components are generated by the distortion generator when used as a predistorter.

Figure 2:
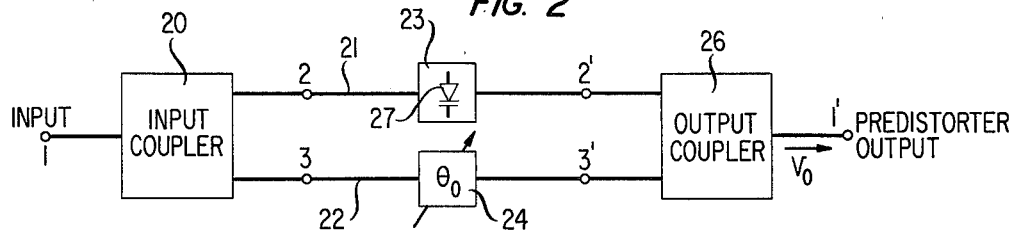
FIG. 2 shows, in block diagram, a distortion generating circuit in accordance with the present invention.

FIG. 2 now to be considered, shows, in block diagram, a distortion generator in accordance with the present invention comprising: an input coupler 20; an output coupler 26; and two interconnecting wavepaths 21 and 22. The former wavepath 21 includes a nonlinear phase modulator 23 comprising at least one voltage dependent reactive element 27 such as, for example, a varactor diode. The latter wavepath 22 includes a linear phase shifter 24. In operation, an input signal applied to port 1 of coupler 20 is divided into two components. The first, smaller of the two signal components, experiences a signal amplitude-dependent phase modulation as it propagates through wavepath 21. The other of the signal components experiences a signal amplitude-independent phase shift as it propagates through wavepath 22. The two components are then recombined in output port 1' of output coupler 26. The resulting signal, including distortion components, is in turn coupled to the device to be compensated, i.e., amplifier 10.

The circuit is most conveniently analyzed in terms of a single frequency input signal. While the analysis is not rigorous, it does provide a qualitative picture of the operation of the predistorter. Standard formulae can then be employed to relate the single frequency nonlinearities to the intermodulation coefficients. (See, for example, G. L. Heiter "Characterization of Nonlinearities in Microwave Devices and Systems," *IEEE Trans. MTT,* 21, 12, December 1973.)

Proceeding in this manner, the output signal $\vec{v_0}$, at the predistorter output terminal 1', is the vector sum of the two signal components $\vec{v_1^*}$ and $\vec{v_2^*}$ derived from wavepaths 22 and 21, respectively. At the operating frequency, $\omega_0$, phase shifter 24 produces a power-independent phase retardation of $\theta_0$ in signal $\vec{v_1^*}$. Since only relative phase shifts are of interest, $\vec{v_1^*}$ can be used as the reference signal in which case one can consider that the phase shifter 24 produces a relative phase advance of $\theta_0$ in signal $\vec{v_2^*}$. In addition, signal $\vec{v_2^*}$ is phase modulated by modulator 23 which produces an rms phase deviation $\theta_2$ that is a function of the instantaneous voltage of the signal applied thereto. Accordingly, $\vec{v_0}$, $\vec{v_1^*}$, and $\vec{v_2^*}$ can be expressed as $$\vec{v_0} = \vec{v_1^*} + \vec{v_2^*}; \qquad (1)$$

$$\vec{v_1^*} = v_1 \cos \omega_0 t; \qquad (2)$$

and $$\vec{v_2^*} = V_2 \cos(\omega_0 t + \theta_0 + \theta_2). \qquad (3)$$

$\theta_2$, the rms phase modulation, is given by $$(d_2 d_1 k_0)(V_1)^2 / 2R_0; \qquad (4)$$

where $d_1$ and $d_2$ are the coupling ratios of couplers 20 and 26, respectively, and have values that are much less than one;

$k_0$ is the phase conversion coefficient of the diode in degrees/watt; and $R_0$ is the transmission line impedance of the diode circuit.

The specific relation for $\theta_2$ given by equation (4) is for a particular phase modulator, as will be explained in greater detail hereinbelow. If other modulator circuits are employed, similar relationships can be derived.

The magnitude $V_0$ and the phase, $\theta$, of the predistorter output voltage are given by $$V_0 = \{[V_1 + V_2 \cos(\theta_0 + \theta_2)]^2 + [V_2 \sin(\theta_0 + \theta_2)]^2\}^{\frac{1}{2}} \qquad (5)$$

and $$\tan \theta = [V_2 \sin(\theta_0 + \theta_2)] / [V_1 + V_2 \cos(\theta_0 + \theta_2)] \qquad (6)$$

For the practical case where $V_2 << V_1$, equations (5) and (6) simplifify to $$V_0 \approx V_1[1 + (V_2/V_1)(\cos\theta_0\cos\theta_2 - \sin\theta_0\sin\theta_2)] \qquad (7)$$

and $$\tan \theta \approx (V_2/V_1)(\sin\theta_0\cos\theta_2 + \cos\theta_0\sin\theta_2) \qquad (8)$$

From equations (7) and (8), the effect of different phase shifts can be noted. For example, for $\theta_0 = 0°$ or 180° (and noting that $\theta_2$ and $V_2/V_1$ are both very small quantities) $V_0$ is essentially equal to $V_1$ and $\theta \approx \pm \theta_2$. Thus, for these cases the predistorter produces essentially only a signal amplitude-dependent phase shift of equal or opposite polarity, respectively. For $\theta_0 = 90°$ or 270°, the output voltage $V_0$ is approximately equal to $\sqrt{V_1^2 + V_2^2}$, and $\tan \theta$ is constant. Thus, in these cases only nonlinear amplitude variations of the compressive or expansive type, respectively, are produced. It should be noted at this point that these amplitude variations are produced by purely reactive means. For other values of $\theta_0$, the entire range of nonlinearities can be simulated, as illustrated in FIGS. 3, 4, 5 and 6.

Figure 3:
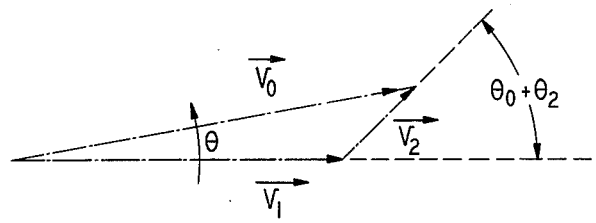
FIGS. 3, 4, 5 and 6 are vector diagrams characterizing the operation of the distortion circuit of FIG. 2 for different values of $\theta_o$.

FIG. 3 shows the case where the fixed phase shift $\theta_0$ is greater than zero but less than 90°. Assume, for the purpose of discussion, that it is a property of the particular nonlinear phase modulator that as the input signal level increases, the rms phase shift $\theta_2$ increases. This causes $\theta$ to increase and $V_0$ to decrease. The resulting nonlinear amplitude characteristic is compressive (i.e., $\vec{v_0}$ decreases with increasing signal), and phase characteristic is inductive (AM-PM conversion such that $\theta$ increases with increasing signal).

Figure 4:
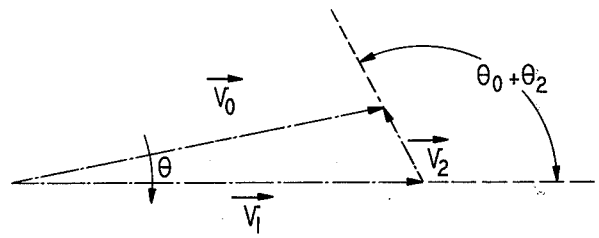

With $\theta_0$ between 90° and 180°, as in FIG. 4, $\vec{v_0}$ decreases and $\theta$ decreases with increasing signal level producing a compressive, capacitive AM-PM nonlinear characteristic.

Figure 5:
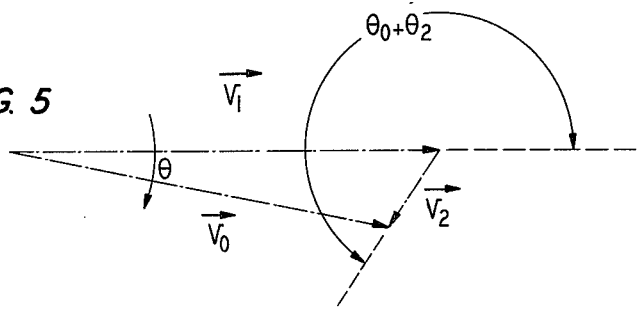
Figure 6:
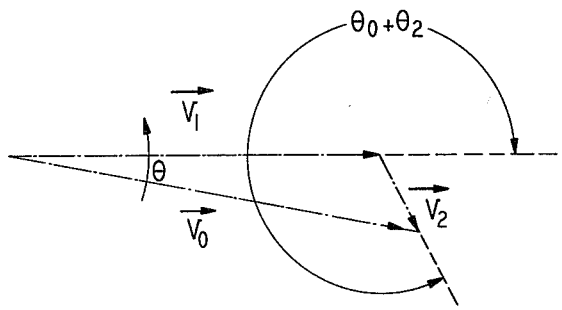

FIG. 5 illustrates the expansive, capacitive AM-PM characteristic obtained for $180° < \theta_0 < 270°$, and FIG. 6 illustrates the expansive, inductive AM-PM characteristic obtained when $270° < \theta_0 < 360°$. Thus, knowing the nature of the nonlinearity of the signal device to be compensated, the phase shifter 24 is designed to obtain the appropriate offset $\theta_0$ for producing the appropriate type of compensating nonlinear characteristic in the distortion generator. Once the proper offset angle is established, the ratio of linear-to-distortion power output from the predistorter $(V_2/V_1)^2$ is matched to that of the device by either changing the bias voltage on the nonlinear diode, or by adjusting the coupling ratio $d_1$ of the input coupler.

Figure 7:
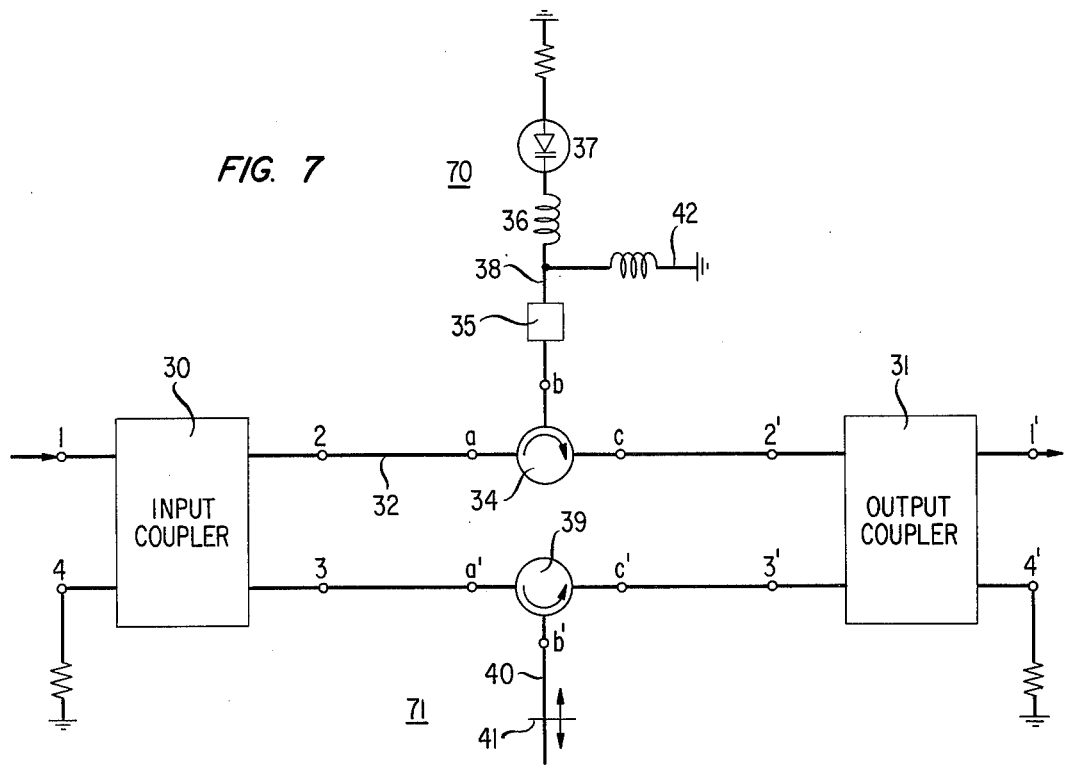
FIGS. 7 and 8 show two specific embodiments of the invention.

FIG. 7 shows in greater detail a predistorter in accordance with the present invention. In this embodiment, the input and output couplers 30 and 31 are four-port hybrid couplers of which one pair of conjugate ports 2-3 of coupler 30 is connected to a pair of conjugate ports 2'-3' of coupler 31 by means of wavepaths 32 and 33. The nonlinear phase modulator 70 is coupled to wavepath 32 by means of circulator 34 whose input port a is connected to port 2 of coupler 30 and whose output port c is connected to port 2' of coupler 31. The intermediate port b of circulator 34 is connected to the phase modulator which comprises a varactor diode 37 and a series resonating inductor 36. Optionally, a filter 35 can be included for suppressing any undesired harmonics of the input signals produced by diode 37. A d.c. return path 42 is provided for the diode.

The linear phase shifter 71 is coupled to wavepath 33 by means of a second circulator 39 whose input port a' is connected to port 3 of coupler 30 and whose output port c' is connected to port 3' of coupler 31. Intermediate port b' of circulator 39 is connected to the linear phase shifter 71 which comprises a length of transmission line 40 that is terminated by means of a movable short circuit 41.

Figure 8:
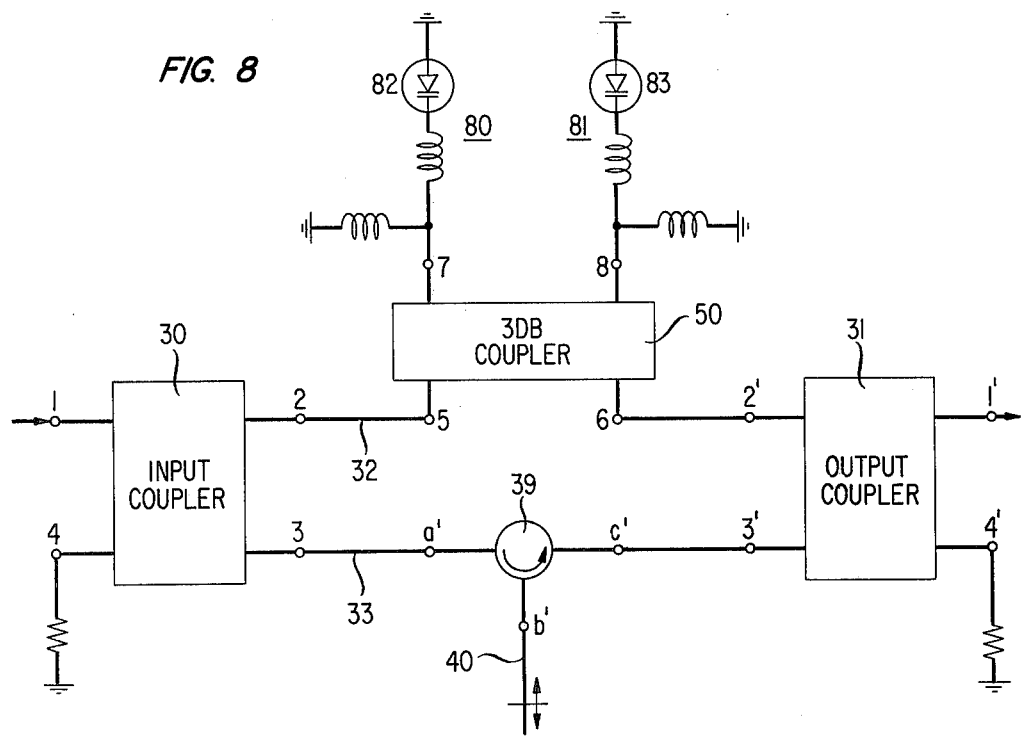

In multifrequency operation, the diode circuit is tuned to resonance at the center of the frequency band of interest, and the short circuit 41 adjusted to provide the desired offset $\theta_0$. In those cases where $90° < \theta_0 < 270°$, illustrated in FIGS. 4 and 5, there is a component of $\vec{v_2^*}$ that combines destructively with $\vec{v_1^*}$, reducing the magnitude of the input signal applied to amplifier 10. To avoid this loss, the coupling between the resonant diode circuit and wavepath 38 is advantageously made critical. When this is done, the fundamental component of the incident signal is totally absorbed by the resonant circuit and only the intermodulation components produced by the nonlinear phase modulation process are reflected back to circulator 34 and onto the output port of the predistorter. With no fundamental component reflected from the modulator circuit, there is no component available to interact destructively with signal $\overline{v}_1'$.

Where more distortion power is required, two diodes 82 and 83 can be employed as shown in FIG. 8. In this embodiment, circulator 34 is replaced by a 3 dB, quadrature coupler 50, and the single phase modulator 70 is replaced by a pair of phase modulators 80 and 81, where each includes one of the diodes 82 and 83 embedded in an appropriately tuned resonant circuit. More specifically, port 2 of input coupler 30 is connected to one of the ports 5 of a pair of conjugate ports 5, 6 of coupler 50. Port 2' of output coupler 31 is connected to port 6 of coupler 50. Resonant circuits 80 and 81 are connected to the second pair of conjugate ports 7 and 8 of coupler 50.

In operation, components of the input signal simultaneously energize both phase modulators 80 and 81 whose outputs combine constructively in coupler port 6. By using two diodes in the manner described, twice the distortion voltage is produced.

While the circuit has been characterized as a predistorter, it will be recognized that it can just as readily be used as a postdistorter and be placed after the device to be compensated. Similarly, the particular linear phase shifter described is only illustrative. Other types, such as that described on page 331 of the book entitled *Microwave Semiconductor Devices and Their Circuit Applications*, edited by H. A. Watson and published by McGraw-Hill Book Company, can also be used.

What is claimed is:

1. A distortion compensating circuit for generating selected nonlinear amplitude and nonlinear phase distortion comprising:

an input coupler (30) having an input port (1) and two output ports (2, 3);

an output coupler (31) having two input ports (2', 3') and an output port (1');

a first wavepath (32), coupled to a nonlinear circuit (70), connecting an output port (2) of said input coupler (20) and an input port (2') of said output coupler (31);

and a second wavepath (33), coupled to a linear phase shifter (71), connecting the other output port (3) of said input coupler (30) and the other input port (3') of said output coupler (32);

CHARACTERIZED IN THAT:

said nonlinear circuit (70) is solely a phase modulator;

and in that the phase shift produced by said phase modulator is a function of the power of the signal in said first wavepath.

2. The circuit according to claim 1 wherein an input signal applied to port 1 of the input coupler (30) produces two signal components at port (4') of the output coupler (31);

the one component that traverses said second wavepath (33) is a replica of the input signal; whereas the other component that traverses said first wavepath (21) is

CHARACTERIZED IN THAT:

said nonlinear circuit (70) serves solely to phase modulate said other signal component.

3. The circuit according to claim 1

CHARACTERIZED IN THAT:

said nonlinear circuit (70) includes at least one voltage dependent reactance (37) embedded in a resonant circuit;

and in that said nonlinear circuit (70) is coupled to said first wavepath (32) by means of a circulator (34).

4. The circuit according to claim 1

CHARACTERIZED IN THAT:

said nonlinear circuit (70) includes a pair of voltage dependent reactances, each of which is embedded in a resonant phase modulating circuit (80, 81);

and in that said resonant circuits (80, 81) are coupled to said wavepath (32) by means of a 3 dB, quadrature coupler (50).

5. The circuit according to claim 1

CHARACTERIZED IN THAT:

the phase shift introduced by said phase shifter (71) is selected as a function of the combined nonlinear amplitude and nonlinear phase characteristic to be compensated.

* * * * *